United States Patent
Xu et al.

(10) Patent No.: US 11,315,625 B2
(45) Date of Patent: Apr. 26, 2022

(54) DATA EDGE JUMPING METHOD

(71) Applicant: AMLOGIC (SHANGHAI) CO., LTD., Shanghai (CN)

(72) Inventors: Chuanting Xu, Shanghai (CN); Kun Zhang, Shanghai (CN)

(73) Assignee: AMLOGIC (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/341,746

(22) PCT Filed: Oct. 31, 2018

(86) PCT No.: PCT/CN2018/113144
§ 371 (c)(1),
(2) Date: Apr. 12, 2019

(87) PCT Pub. No.: WO2019/114450
PCT Pub. Date: Jun. 20, 2019

(65) Prior Publication Data
US 2021/0327492 A1    Oct. 21, 2021

(30) Foreign Application Priority Data
Dec. 13, 2017 (CN) .......................... 201711329849.3

(51) Int. Cl.
*G11C 11/408* (2006.01)
*G11C 11/56* (2006.01)
(52) U.S. Cl.
CPC ...... *G11C 11/4087* (2013.01); *G11C 11/4085* (2013.01); *G11C 11/5642* (2013.01)

(58) Field of Classification Search
CPC ............ G11C 11/4087; G11C 11/4085; G11C 11/5642
USPC ..................................................... 365/230.06
See application file for complete search history.

(56) References Cited

U.S. PATENT DOCUMENTS

2017/0054580 A1* 2/2017 Hollis ................. H04L 25/4917
2019/0378003 A1* 12/2019 Otsuka .................... G11C 11/54

FOREIGN PATENT DOCUMENTS

| CN | 101047020 A | 10/2007 |
| CN | 102289278 A | 12/2011 |
| CN | 106849954 A | 6/2017 |

* cited by examiner

*Primary Examiner* — Anthan Tran
(74) *Attorney, Agent, or Firm* — SoCal IP Law Group LLP; Mark Andrew Goldstein

(57) ABSTRACT

The invention relates to a data edge jumping method, applied to a memory system, wherein the memory system comprises a processor and a memory driven by the processor, and a plurality of groups of data lines are connected between the processor and the memory. The data edge jumping method comprising: coding data output by the processor to enable total current produced by data transmission through each of the plurality of groups of data lines at the same time to be zero; transmitting the coded data through the plurality of groups of data cables, and decoding the data before reaching the memory; and inputting the decoded data into the memory, and enabling the total current produced in the data lines to be close to 0 A, so that electromagnetic interference is hardly produced by signals transmitted through the data lines, and allowance of signal radiation is large enough.

7 Claims, 1 Drawing Sheet

DATA EDGE JUMPING METHOD

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

RELATED APPLICATION INFORMATION

This patent claims priority from International PCT Patent Application No. PCT/CN2018/113144, filed Oct. 31, 2018 entitled, DATA EDGE JUMPING METHOD, which claims priority to Chinese Application No. 201711329849.3, filed Dec. 13, 2017 entitled, DATA EDGE JUMPING METHOD, all of which are incorporated herein by reference in their entirety.

BACKGROUND OF THE INVENTION

1. Field of the Invention

The invention relates to the technical field of integrated circuits, and more particularly, to a data edge jumping method.

2. Description of the Related Art

DDR (Double Data Rate) with control lines, address lines, and data lines are generally used as a memory in the system. A signal entering the DDR through the data lines comes from a processor chip, which has a high requirement on a power supply with respect to the power supply capabilities. Supposing a following model: in a processing chip system where Vcc=1.5V, 32 output data lines are provided for the DDR, the capacitive load of a single data line is C=15 pF, and the output driver needs to drive a load from 0V to 1.5V within a rise time Tr=0.8 ns. As can be seen, when the output of the processing chip rises from 0V to 1.5V, the current required for the single data line is: I=C×(dV/dt)=15 pF×(1.5V/0.8 ns)=28 mA; when all of the 32 data lines rise from 0V to 1.5V at the same time, the current when flipping is I=28 mA×32=0.896A. Such an amount of current tends to have a high energy signal radiating into the space, resulting in excessive radiation emission or insufficient allowance of radiation emission.

SUMMARY OF THE INVENTION

In order to solve the foregoing problems exist in the prior art, the present invention provides a data edge jumping method applied to a memory system, wherein the memory system comprises a processor and a memory driven by the processor, wherein a plurality of groups of data lines are connected between the processor and the memory, the data edge jumping method comprising:

Step S1, coding data output by the processor to enable total current produced by data transmission through each of the plurality of groups of data lines at the same time to be zero;

Step S2, transmitting the coded data through the plurality of groups of data lines, and decoding the data before reaching the memory; and Step S3, inputting the decoded data into the memory.

In the above-mentioned jumping method, the number of lines in each of the plurality of groups of data lines is 8.

In the above-mentioned jumping method, the number of groups in the plurality of groups of data lines is 4.

In the above-mentioned jumping method, in Step S1, an encoder is provided for performing a coding operation.

In the above-mentioned jumping method, the encoder is integrated into the processor.

In the above-mentioned jumping method, in Step S2, a decoder is provided for performing a decoding operation.

In the above-mentioned jumping method, the decoder is integrated into the memory.

In the above-mentioned jumping method, the memory is a Double Data Rate Random Access Memory.

The disclosed technical solution provides advantageous effects including enabling the total current produced in the data lines to be close to OA, so that electromagnetic interference is hardly produced by signals transmitted through the data lines, and allowance of signal radiation is large enough.

BRIEF DESCRIPTION OF THE DRAWINGS

The accompanying drawings, together with the specification, illustrate exemplary embodiments of the present disclosure, and, together with the description, serve to explain the principles of the present invention.

DETAILED DESCRIPTION

Figure 1:
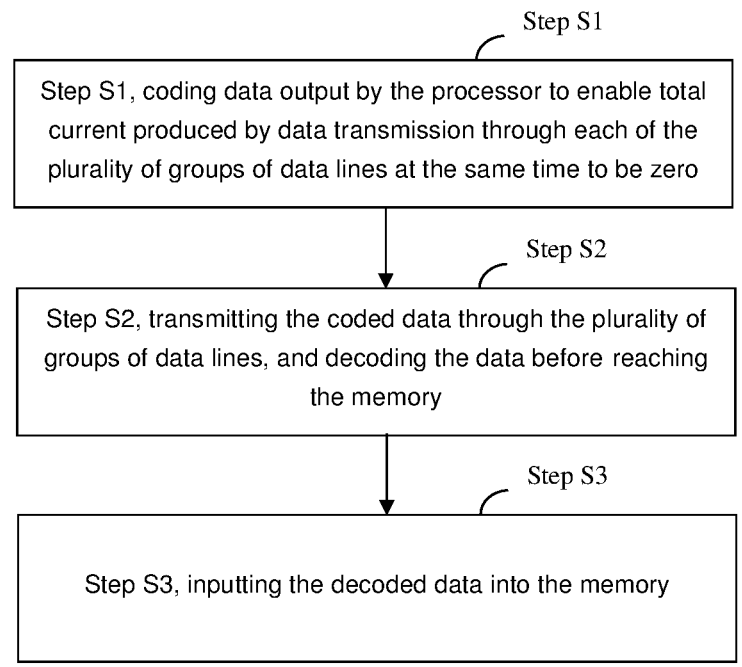
FIG. 1 is a flowchart showing steps of a data edge jumping method according to an embodiment of the present invention.
Figure 2:
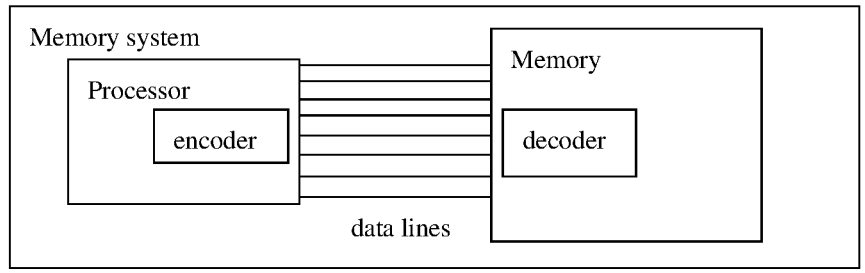
FIG. 2 is a block diagram of a memory system.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, the term "plurality" means a number greater than one.

Hereinafter, certain exemplary embodiments according to the present disclosure will be described with reference to the accompanying drawings.

As shown in FIG. 1, in a preferred embodiment, the invention provides a data edge jumping method applied to a memory system, wherein the memory system comprises a processor and a memory driven by the processor, wherein a plurality of groups of data lines are connected between the processor and the memory, the data edge jumping method comprising:

Step S1, coding data output by the processor to enable total current produced by data transmission through each of the plurality of groups of data lines at the same time to be zero;

Step S2, transmitting the coded data through the plurality of groups of data cables, and decoding the data before reaching the memory; and Step S3, inputting the decoded data into the memory.

In the above-mentioned technical solution, the memory is DDR memory. The number of data lines in each group of the plurality of groups of data lines should be an even number. A specific algorithm can be used to ensure that in the same group of data lines, the amount of data lines through which data is written to the DDR is equal to the amount of data lines through which data is read out from the DDR, and thus the current in both directions can be cancelled out, and electromagnetic interference produced thereof can be minimized.

In a preferred embodiment, the number of lines in each group of the plurality of groups of data lines is 8. However, the above example should not be considered to be limiting of the present invention, but be understood as presenting only a preferred scenario. Thus, the other number of data lines (except for 8) is also construed as falling into the scope of the present invention.

In a preferred embodiment, 4 groups of data lines are set. However, the above example should not be considered to be limiting of the present invention, but be understood as presenting only a preferred scenario. Thus, the other number of groups of data lines (except for 4 groups) is also construed as falling into the scope of the present invention.

In a preferred embodiment, in Step S1, an encoder is provided for performing a coding operation.

In the above-mentioned embodiment, preferably, the encoder is integrated into the processor.

In a preferred embodiment, in Step S2, a decoder is provided for performing a decoding operation.

In the above-mentioned embodiment, preferably, the decoder is integrated into the memory.

In a preferred embodiment, the memory is a Double Data Rate Random Access Memory.

In conclusion, the present invention provides a data edge jumping method applied to a memory system, wherein the memory system comprises a processor and a memory driven by the processor, wherein a plurality of groups of data lines are connected between the processor and the memory, the data edge jumping method comprising: Step S1, coding data output by the processor to enable total current produced by data transmission through each of the plurality of groups of data lines at the same time to be zero; Step S2, transmitting the coded data through the plurality of groups of data cables, and decoding the data before reaching the memory; and Step S3, inputting the decoded data into the memory. The disclosed technical solution provides advantageous effects including enabling the total current produced in the data lines to be close to 0 A, so that electromagnetic interference is hardly produced by signals transmitted through the data lines, and allowance of signal radiation is large enough.

The above descriptions are only the preferred embodiments of the invention, not thus limiting the embodiments and scope of the invention. Those skilled in the art should be able to realize that the schemes obtained from the content of specification and drawings of the invention are within the scope of the invention.

It is claimed:

1. A data edge jumping method applied to a memory system,
   wherein the memory system comprises a processor and a memory driven by the processor,
   wherein a plurality of groups of data lines are connected between the processor and the memory, the data edge jumping method comprising:
   Step S1, coding data output by the processor to enable total current produced by data transmission through each of the plurality of groups of data lines at the same time to be zero;
   Step S2, transmitting the coded data through the plurality of groups of data cables, and decoding the data in the memory;
   wherein a decoder is integrated into the memory;
   wherein a number of data lines in each group of the plurality of groups of data lines are an even number,
   wherein the data lines through which data is written to the memory is equal to an amount of data lines through which data is read out from the memory.

2. The jumping method as claimed in claim 1, wherein the number of lines in each of the plurality of groups of data lines is 8.

3. The jumping method as claimed in claim 1, wherein the number of groups in the plurality of groups of data lines is 4.

4. The jumping method as claimed in claim 1, wherein in Step S1, an encoder is provided for performing the coding operation.

5. The jumping method as claimed in claim 4, wherein the encoder is integrated into the processor.

6. The jumping method as claimed in claim 1, wherein in Step S2, the decoder is provided for performing the decoding operation.

7. The jumping method as claimed in claim 1, wherein the memory is a Double Data Rate Random Access Memory.

* * * * *